United States Patent
Ha et al.

(10) Patent No.: US 7,235,445 B2
(45) Date of Patent: Jun. 26, 2007

(54) METHODS OF FORMING DEVICE WITH RECESSED GATE ELECTRODES

(75) Inventors: Jae-Kyu Ha, Gyeonggi-do (KR); Jong-Chul Park, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 51 days.

(21) Appl. No.: 11/148,760

(22) Filed: Jun. 9, 2005

(65) Prior Publication Data

US 2005/0277254 A1    Dec. 15, 2005

(30) Foreign Application Priority Data

Jun. 11, 2004    (KR) ..................... 10-2004-0043053

(51) Int. Cl.
*H01L 21/336*    (2006.01)
(52) U.S. Cl. ..................... 438/259; 438/270
(58) Field of Classification Search ............. 438/157, 438/195, 257, 259, 270, 700; 257/314, 315, 257/319
See application file for complete search history.

(56) References Cited

U.S. PATENT DOCUMENTS

| | | | |
|---|---|---|---|
| 6,200,856 B1 * | 3/2001 | Chen ......................... 438/257 |
| 6,218,690 B1 * | 4/2001 | Kim et al. .................. 257/288 |
| 6,562,681 B2 * | 5/2003 | Tuan et al. ................. 438/257 |
| 6,570,215 B2 * | 5/2003 | Tuan et al. ................. 257/315 |
| 6,682,977 B2 * | 1/2004 | Chang ........................ 438/257 |
| 2004/0067618 A1 * | 4/2004 | Chang et al. ............... 438/264 |
| 2004/0195608 A1 * | 10/2004 | Kim et al. .................. 257/296 |
| 2005/0070112 A1 * | 3/2005 | Pita et al. ................... 438/700 |
| 2005/0218458 A1 * | 10/2005 | Kim et al. .................. 257/368 |
| 2005/0250284 A1 * | 11/2005 | Park ........................... 438/270 |
| 2005/0275063 A1 * | 12/2005 | Sumino et al. ............ 257/544 |
| 2005/0287732 A1 * | 12/2005 | Kubo et al. ................ 438/212 |

FOREIGN PATENT DOCUMENTS

| | | |
|---|---|---|
| JP | 07-335668 | 12/1995 |
| KR | 10 2002 0049806 | 6/2002 |

* cited by examiner

*Primary Examiner*—Thao P. Le
(74) *Attorney, Agent, or Firm*—Myers Bigel Sibley & Sajovec, P.A.

(57) ABSTRACT

Methods are provided for forming a device, such as a semiconductor device. A field region and an active region of a substrate are defined in which the field region has an upper surface that extends further away from the substrate and is higher than an upper surface of the active region. A hard mask layer is formed with a substantially planar upper surface on the field region and the active region. The hard mask layer is partially etched to form a hard mask pattern that exposes at least a portion of the active region. The substrate is partially etched in the active region using the hard mask pattern as an etching mask to form a gate trench. A recessed gate electrode if formed on the substrate in the gate trench.

19 Claims, 13 Drawing Sheets

METHODS OF FORMING DEVICE WITH RECESSED GATE ELECTRODES

CROSS REFERENCE TO RELATED APPLICATION

This application claims priority under 35 USC § 119 to Korean Patent Application No. 10-2004-0043053, filed on Jun. 11, 2004, the contents of which are incorporated by reference in its entirety.

FIELD OF THE INVENTION

The present invention relates to methods of forming semiconductor devices and, more particularly, to method of forming a gate electrode in a transistor.

BACKGROUND OF THE INVENTION

As semiconductor devices have become more highly integrated, the size of active regions therein has been reduced. In some semiconductor devices, the channel region of a MOS transistor can be constrained to sub-micro lengths. As the length of the channel region becomes smaller, the source/drain regions of the MOS transistor can have a larger electrical influence on depletion layers that are adjacent to the source/drain regions. This influence can be referred to as a short channel effect.

One short channel effect is to decrease the threshold voltage Vt of a MOS transistor. The decreased threshold voltage Vt due to short channel effect can be associated with an electric field and electric potential distribution in the depletion layers of the transistor as well as a voltage applied to a gate electrode of the MOS transistor.

Another example of the short channel effect is a decrease in the breakdown voltage between the source/drain regions. The width of the depletion layer adjacent to the drain region is proportional to the drain voltage, such that the depletion layer adjacent to the drain region can become close to the depletion layer adjacent to the source region. As the length of the channel region is shortened, the depletion layers of the drain region and source region can overlap (e.g., become electrically connected) so that an electric field in the drain region can then influence the source region and the electric potential available to diffuse electrons in the source region is thereby lowered. Consequently, although the channel region doesn't extend between the source/drain regions, a current nevertheless can flow between the source/drain regions. This effect can be referred to as punch-through. When punch-through occurs, a current that flows through the drain region can substantially increase without the transistor operating in a saturated region.

To increase the memory capacity of a semiconductor device, such as a dynamic random access memory (DRAM) device, unit cells may be formed in small areas of a substrate. To obtain a predetermined capacitance level for a cell capacitor, the length of the gate electrode can be shortened to form a highly-integrated cell. A short channel effect may occur as the length of the channel region is shortened in proportion to shortening of the length of the gate electrode, which may cause a decrease in the threshold voltage and increase in the leakage current of the cells. In highly integrated cells, adjacent gate electrodes are closely spaced. Forming a miniature contact between closely spaced adjacent gate electrodes can be very difficult.

In an attempt to reduce the short channel effect and improve the refresh characteristics of a cell transistor, some transistors have included a recessed channel. A recessed channel may allow a transistor to have an elongated gate electrode length without increasing a horizontal area of the gate electrode. The transistor can include a gate electrode that is formed in a trench in a surface portion of a substrate. The recessed channel can be formed along an inner wall and bottom face of the trench.

A transistor having a recessed channel can be formed by forming an isolation layer on a substrate to divide the substrate into an active region and a field region. A trench for a gate electrode is formed in the active region. A hard mask layer is formed on the active region and the field region.

An organic anti-reflective layer is the formed on the hard mask layer. The hard mask layer is patterned by a conventional etching process. The organic anti-reflective layer may partially remain on a lower surface of the hard mask layer. The hard mask layer may not be completely removed from locations where a gate trench is to be formed.

The hard mask layer may have an etching selectivity higher than that of an underlying layer that is to etched. Thus, a portion of the substrate on which the hard mask layer partially remains may not be etched so that the uniformity of the gate trench becomes affected.

FIG. 1 is a scanning electron microscope (SEM) picture that illustrates a hard mask layer pattern that partially remains in a region in which a gate trench is formed.

Referring to FIG. 1, a hard mask layer pattern 1 partially remains on a central portion of a gate trench so that the gate trench is entirely exposed through the hard mask layer pattern 1.

FIGS. 2 and 3 are SEM pictures illustrating a substrate that is etched using the hard mask layer pattern in FIG. 1 as an etching mask.

As shown in FIGS. 2 and 3, since the hard mask layer pattern 1 partially remains on the central portion of the gate trench, an edge portion 2b of the gate trench has a normally etched configuration. In contrast, a central portion 2a of the gate trench is not etched so that the central portion of the gate trench is not uniform (i.e., an abnormally etched configuration).

SUMMARY OF THE INVENTION

In some embodiments of the present invention, a method of forming a device, such as a semiconductor device, includes defining a field region and an active region of a substrate. The field region has an upper surface that extends further away from the substrate and is higher than an upper surface of the active region. A hard mask layer is formed with a substantially planar upper surface on the field region and the active region. The hard mask layer is partially etched to form a hard mask pattern that exposes at least a portion of the active region. The substrate is partially etched in the active region using the hard mask pattern as an etching mask to form a gate trench. A recessed gate electrode if formed on the substrate in the gate trench.

In some further embodiments of the present invention, the field region and the active region may be defined by forming an initial hard mask pattern on the substrate that exposes the field region and covers the active region, partially etching the substrate using the initial hard mask pattern as an etching mask to form an isolation trench in the field region, filling the isolation trench and a space between the initial hard mask patterns in the field region with a field oxide layer. The initial hard mask pattern is removed so that an upper surface of the field oxide layer is higher than an upper surface of the substrate.

After the field region and the active region are defined, a buffer oxide layer may be formed on the field region and the active region. The buffer oxide layer may include a middle temperature oxide layer. The hard mask pattern may include a material having an etching selectivity of about 1:0.9 to about 1:1.1 with respect to the buffer oxide layer. The hard mask pattern may include boron phosphorus silicate glass (BPSG), undoped silicate glass (USG), phosphorus silicate glass (PSG), and/or flowable oxide (FOX).

In some further embodiments of the present invention, an anti-reflective layer may be formed on the hard mask pattern. The anti-reflective layer may include an organic material. The hard mask pattern may be formed by forming a photoresist pattern on the anti-reflective layer that selectively exposes portions of the anti-reflective layer that overlie an area in which the gate trench is to be formed, removing portions of the anti-reflective layer exposed by the photoresist pattern to partially expose portions of the hard mask layer, and removing the exposed portions of the hard mask layer to form the hard mask pattern. The hard mask pattern may form a linear pattern that exposes regions over the substrate in which the gate trench is to be formed and a portion of the field region between adjacent gate trenches. The hard mask pattern may form a dotted pattern that selectively exposes regions over the substrate in which the gate trench is to be formed.

In some other embodiments of the present invention, a method of forming a device, such as a semiconductor device, includes defining a field region and a plurality of active regions of a substrate. The field region has an upper surface that extends further away from the substrate and is higher than an upper surface of the active regions. A buffer oxide layer is formed on the substrate in the active regions. A hard mask layer is formed with a substantially planar upper surface on the buffer oxide layer. An organic anti-reflective layer is formed on the hard mask layer. The organic anti-reflective layer, the hard mask layer and the buffer oxide layer are partially etched to form a hard mask pattern that exposes at least a portion of the active regions. The substrate in the active region is partially etched using the hard mask pattern as an etching mask to form a gate trench. A recessed gate electrode is formed on the substrate in the gate trench.

Accordingly, in some embodiments of the present invention, the hard mask layer can have a substantially planar upper surface on the active region and the field region. When forming the hard mask layer pattern, the substantially planar upper surface of the hard mask layer may allow it to be more completely removed from an area in which the gate trench is to be formed. Consequently, the hard mask layer pattern may be used to form a more uniform gate trench in the substrate because of the more complete removal of the hard mask layer material from the area in which the gate trench is desired to be formed.

DETAILED DESCRIPTION OF EMBODIMENTS OF THE INVENTION

Figure 1:
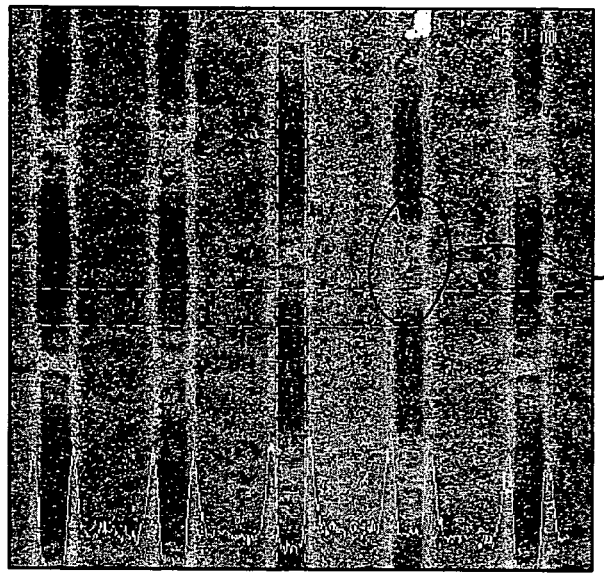
FIG. 1 is a scanning electron microscope (SEM) picture illustrating a hard mask layer pattern that partially remains in a region in which a gate trench is formed in accordance with the prior art.
Figure 2:
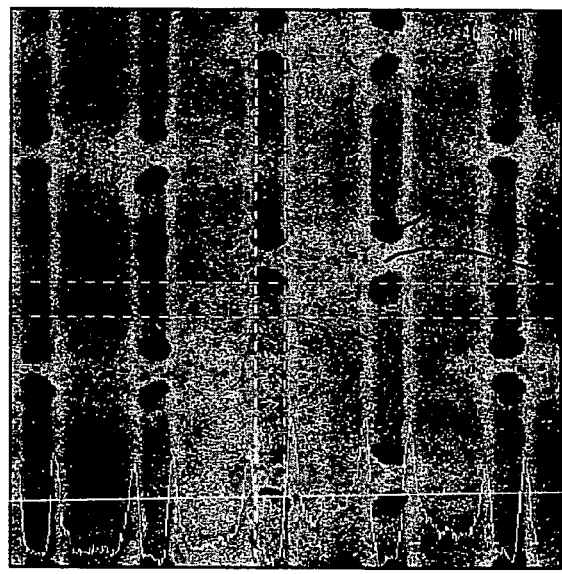
FIGS. 2 and 3 are SEM pictures illustrating a substrate that is etched using the hard mask layer pattern in FIG. 1 as an etching mask in accordance with the prior art.
Figure 3:
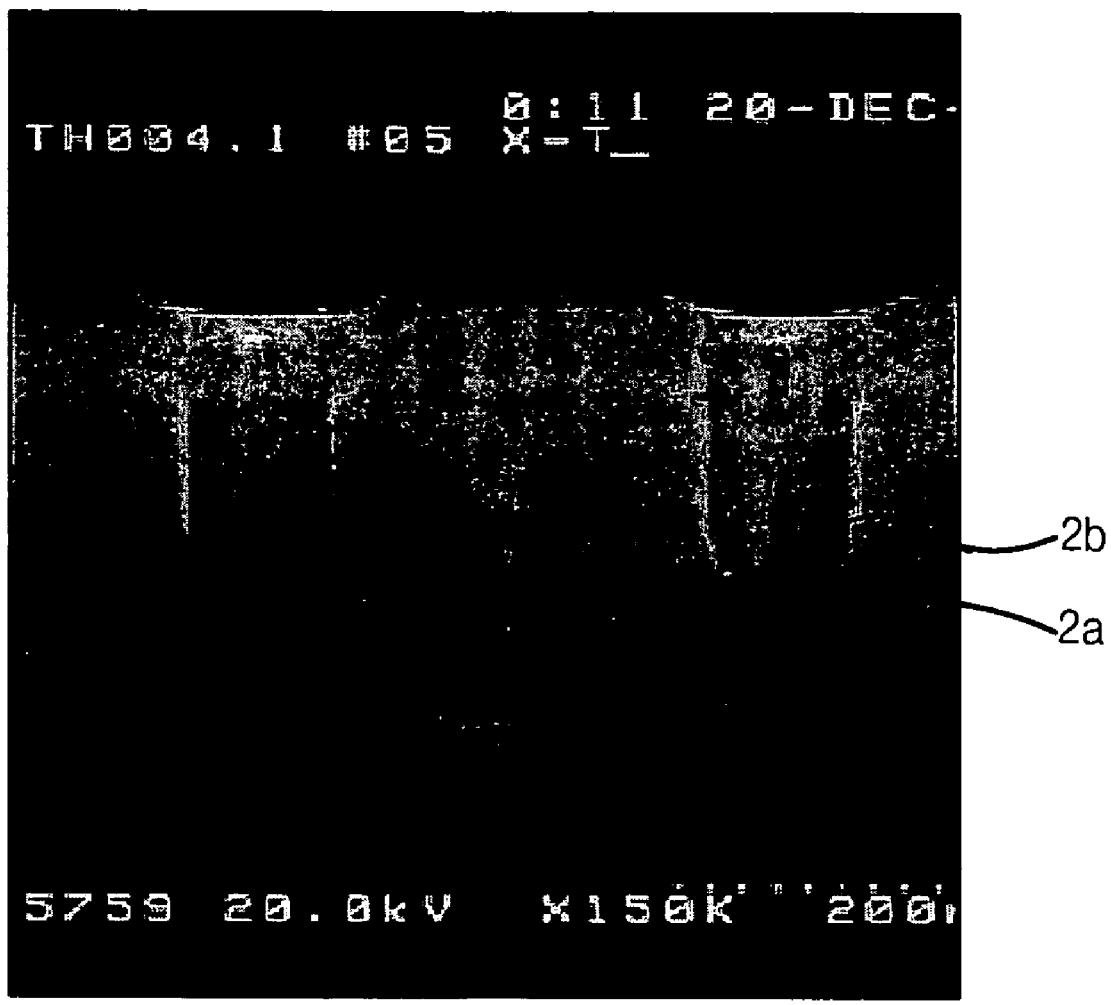

While the invention is susceptible to various modifications and alternative forms, specific embodiments thereof are shown by way of example in the drawings and will be described in detail herein. It should be understood, however, that there is no intent to limit the invention to the particular forms disclosed but on the contrary, the invention is to cover all modifications, equivalents, and alternatives falling within the spirit and scope of the invention as defined by the claims. Like reference numbers signify like elements throughout the description of the figures.

It will be understood that when an element or layer is referred to as being "on," "connected to," or "coupled to" another element or layer, it can be directly on, connected, or coupled to the other element or layer or intervening elements or layers may be present. In contrast, when an element is referred to as being "directly on," "directly connected to," or "directly coupled to" another element or layer, there are no intervening elements or layers present. As used herein, the term "and/or" includes any and all combinations of one or more of the associated listed items.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Furthermore, relative terms, such as "lower" or "bottom" and "upper" or "top" may be used herein to describe one element's relationship to another elements as illustrated in the figures. It will be understood that relative terms are intended to encompass different orientations of the device in addition to the orientation depicted in the figures. For example, if the device in the figures is turned over, elements described as being on the "lower" side of other elements would then be oriented on "upper" sides of the other elements. The exemplary term "lower" can, therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from an implanted to a non-implanted region. Likewise, a buried region formed by implantation may result in some implantation in the region between the buried region and the surface through which the implantation takes place. Thus, the regions illustrated in the figures are schematic in nature and their shapes are not intended to illustrate the precise shape of a region of a device and are not intended to limit the scope of the present invention.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Methods and semiconductor devices in accordance with a first embodiment of the present invention will now be explained below with reference to FIGS. 4–16.

FIGS. 4 to 12 are cross sectional views that illustrate methods of forming a semiconductor device that includes a recessed gate electrode in accordance with a first embodiment of the present invention. FIGS. 13 to 16 are plan views corresponding to FIGS. 5, 9 to 11, respectively. FIGS. 4 to 12 are cross sectional views taken along a line I–I' in FIG. 13 that is substantially perpendicular to a length direction of an active region.

According to the first embodiment of the present invention, the semiconductor device can be a dynamic random access memory (DRAM) device.

Figure 4:
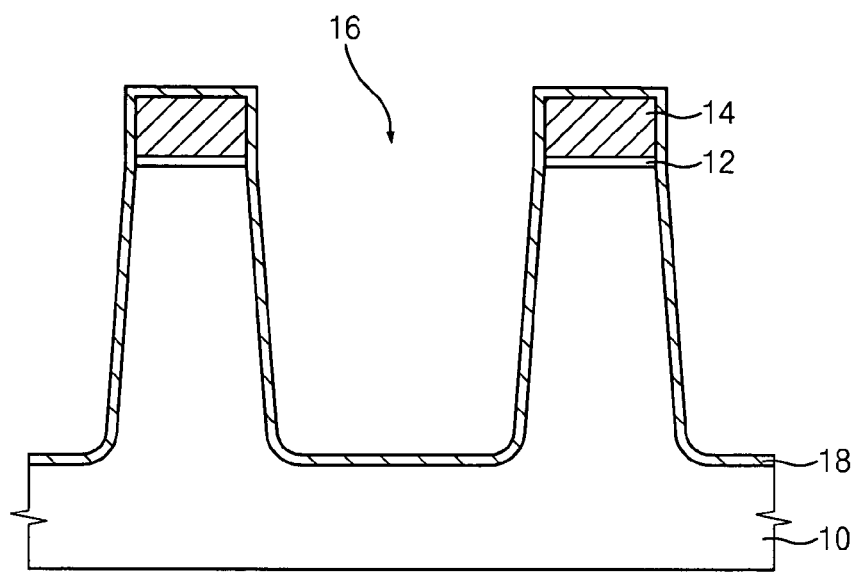
FIGS. 4 to 12 are cross sectional views illustrating methods of forming a semiconductor device that includes a recessed gate electrode in accordance with a first embodiment of the present invention.

Referring to FIG. 4, a first buffer oxide layer (not shown) is formed on a semiconductor substrate 10. A first silicon nitride layer (not shown) is formed on the first buffer oxide layer. The first buffer oxide layer can reduce stresses that can be generated when the first silicon nitride layer makes contact with the semiconductor substrate 10.

A photoresist pattern (not shown) is formed on the first silicon nitride layer. The first silicon nitride layer is partially etched using the photoresist pattern as an etching mask to form a first hard mask pattern 14. The first hard mask pattern 14 partially exposes the field region. The first buffer oxide layer is dry etched using the first hard mask pattern 14 as an etching mask to form a first buffer oxide layer pattern 12. Simultaneously, the semiconductor substrate 10 is dry etched to form an isolation trench 16 having a slanted (i.e., sloped) sidewall. Accordingly, an upper width of the isolation trench 16 is wider than a lower width thereof.

To cure damage on a surface of the dry etched semiconductor substrate 10 after forming the isolation trench 16, an inner side of the isolation trench 16 is thermally oxidized to form a thin thermal oxide layer (not shown).

An insulation layer liner 18, which may have a thickness of hundreds of angstroms, is formed on an inner wall and a bottom face of the isolation trench 16 and the thermal oxide layer, on the first buffer oxide layer pattern 12, and on the first hard mask pattern 14. The insulation layer liner 18 may reduce stress in a field oxide layer that fills the isolation trench 16, and may inhibit/prevent impurities from diffusing into a field region. The insulation layer liner 18 may include, for example, silicon nitride with an etching selectivity that is higher than the field oxide layer.

Figure 5:
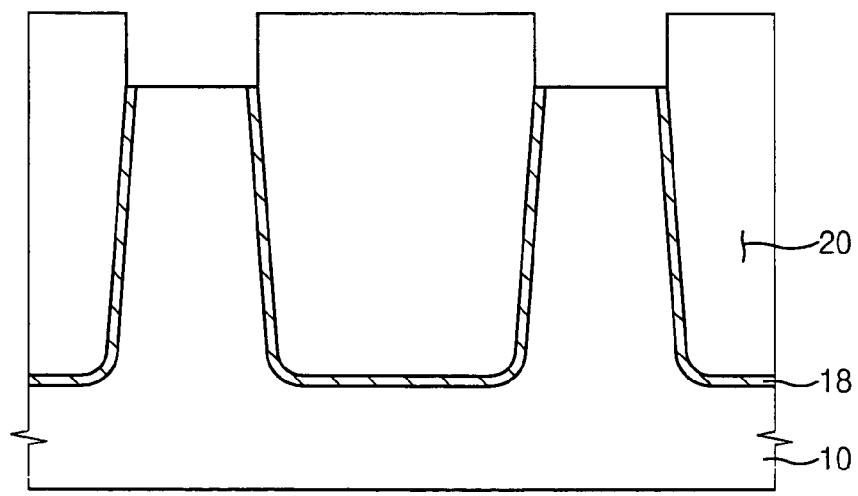
Figure 13:
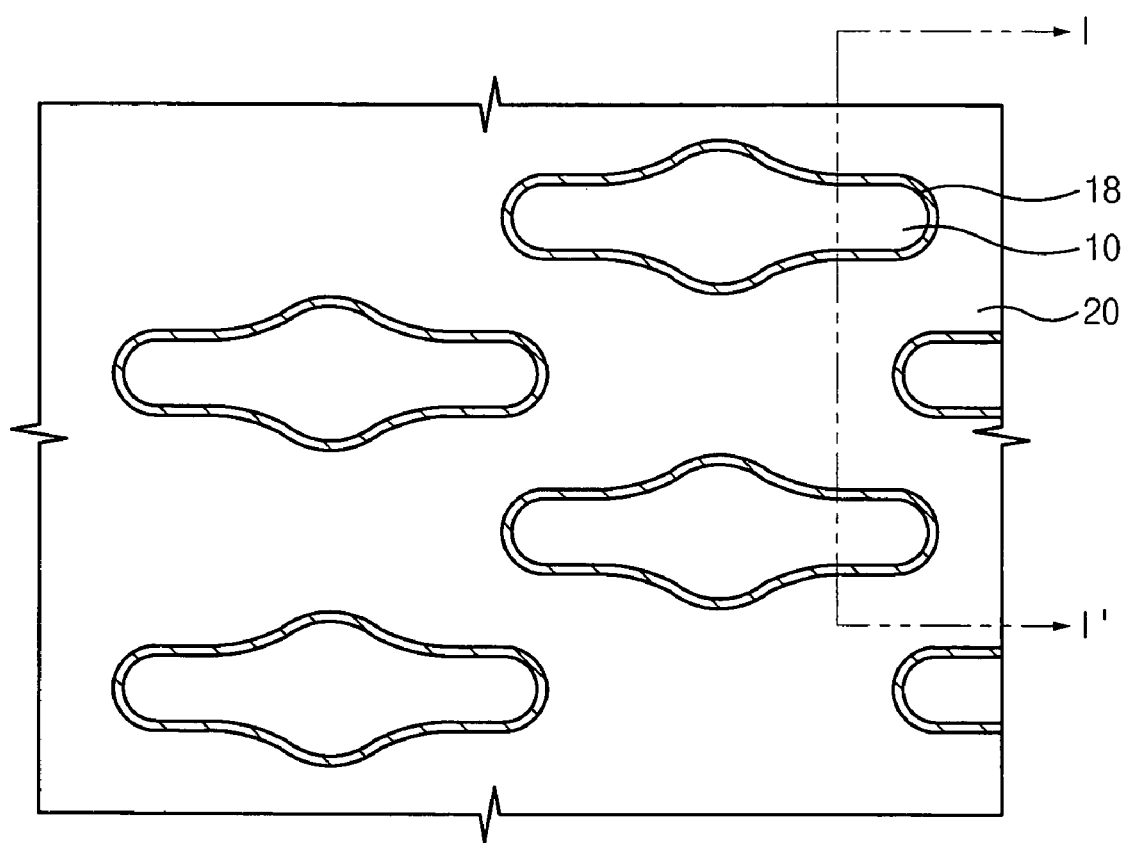
FIGS. 13 to 16 are plan views corresponding to FIGS. 5, 9 to 11, respectively.

Referring to FIGS. 5 and 13, the isolation trench 16 is filled with an oxide layer (not shown). The oxide layer is removed until the first hard mask pattern 14 is exposed to form the field oxide layer 20. The first hard mask pattern 14 is then removed. The field oxide layer 20 divides the semiconductor substrate 10 into an active region and the field region. The field region corresponds to a region in which the field oxide layer 20 is formed. The active region corresponds to a region in which the field oxide layer 20 is not formed and for which the semiconductor substrate 10 remains exposed.

The field region has an upper surface (i.e., the upper exposed surface of the field oxide layer 20) that extends further away from the substrate 10 and is higher than an upper surface of the active regions (i.e., the upper exposed surfaces in the active region between the field oxide layers 20). Accordingly, the step difference between the upper exposed surfaces of the active region and the field region may be substantially equal to or less than a combined height of the first buffer oxide layer 12 and the first hard mask pattern 14.

Figure 6:
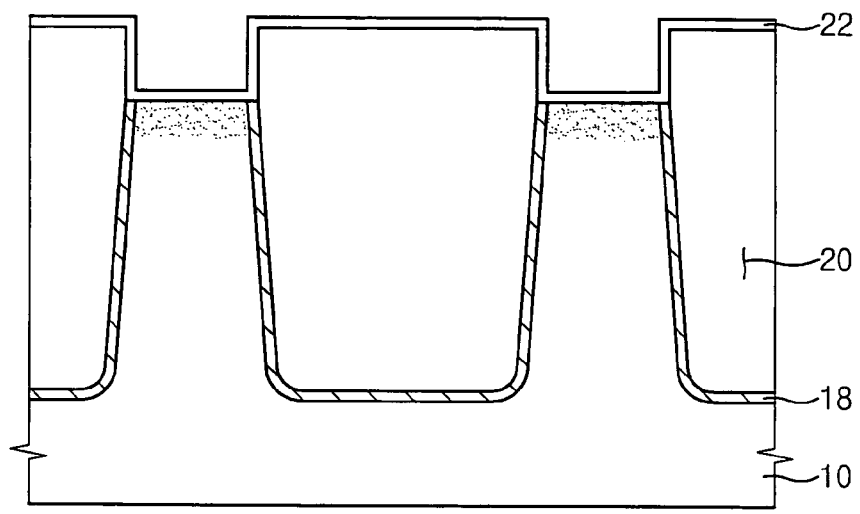

Referring to FIG. 6, a second buffer oxide layer 22, such as a middle temperature oxide layer having a thickness of about 100 Å to about 500 Å, is formed on the semiconductor substrate 10, the field oxide layer 20 and the insulation layer liner 18. As shown, the second buffer oxide layer 22 can conform to the stepped profile between the active region and the field region. The second buffer oxide layer 22 may suppress a diffusion of impurities, which are doped in the semiconductor substrate 10, from moving toward one or more upper layers during one or more subsequent thermal processes. In some embodiments, formation of the second buffer oxide layer 22 may be omitted.

Impurities are implanted, such as by ion implantation, into the active region to form a preliminary source region and a preliminary drain region. The preliminary source region and the preliminary drain region are converted into source/drain regions by an etching process for forming a gate trench. Alternatively, the ion implantation process may be carried out after the recessed channel is formed.

Figure 7:
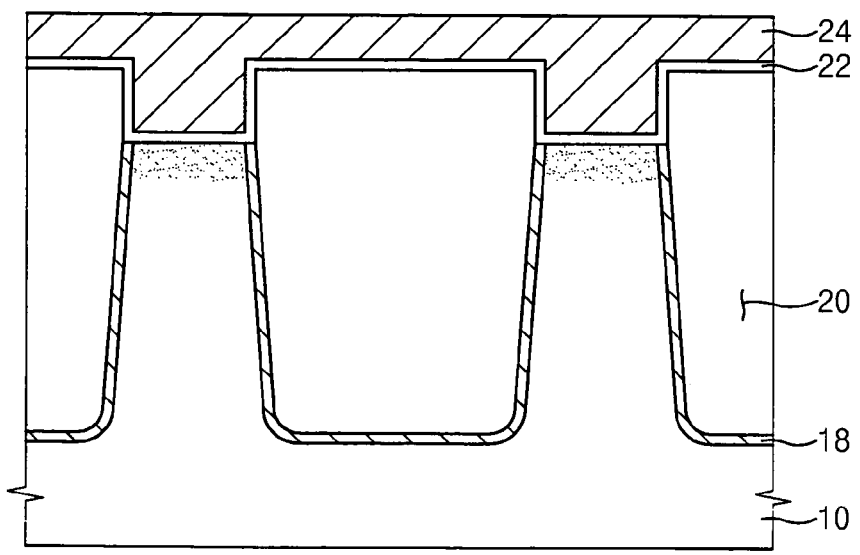

Referring to FIG. 7, a second hard mask layer 24 having a substantially planar upper surface (and which may be precisely planar) is formed on the second buffer oxide layer 22. Accordingly, the second hard mask layer 24 extends across the active regions with a first thickness and extends across the field regions with a second thickness that is less than the first thickness.

The second hard mask layer 24 may have an etching selectivity of about 1:0.9 to about 1:1.1 with respect to the second buffer oxide layer 22 and, may preferably, have an etching selectivity that is substantially identical to that of the second buffer oxide layer 22.

Accordingly, the second hard mask layer 24 may be a silicon based insulation layer, and may include, for example, boron phosphorus silicate glass (BPSG), undoped silicate glass (USG), phosphorus silicate glass (PSG), and/or flowable oxide (FOX).

A layer of BPSG, USG and/or PSG may be formed by a high temperature reflow process for densifying a layer that is formed by a chemical vapor deposition (CVD) process. A substantially planar upper surface of the second hard mark layer 24 may be obtained by the BPSG layer, the USG layer and/or the PSG layer flowing across lower areas during the reflow process.

The FOX layer may be formed by depositing flowable oxide including silicon atoms by a spin coating process, and by annealing the flowable oxide. Flowable oxide may be annealed using hydrogen or nitrogen. The FOX layer that is formed by the spin coating process may thereby have a substantially planar upper surface.

Figure 8:
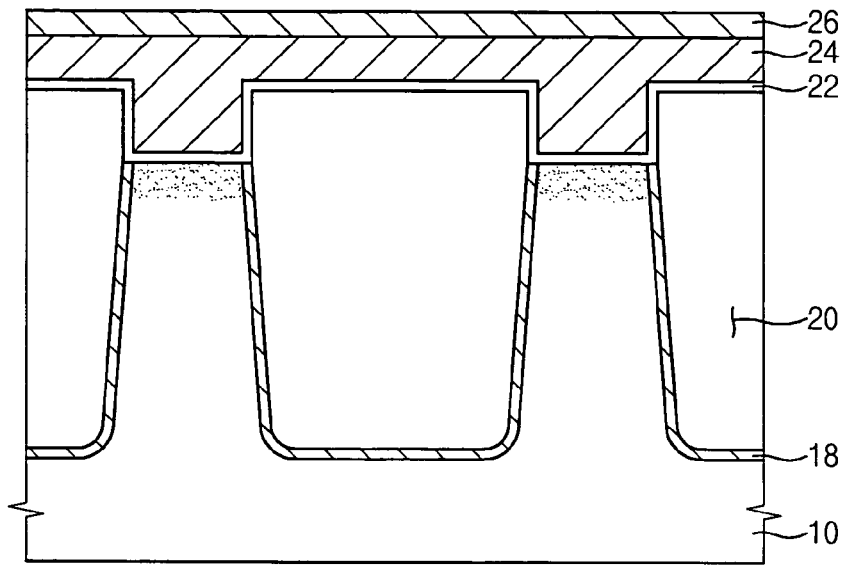

Referring to FIG. 8, an organic anti-reflective layer 26 is formed on the second hard mask layer 24. Because the second hard mask layer 24 has a substantially planar upper surface, the organic anti-reflective layer 26 can also has a substantially planar upper surface. Accordingly, the organic anti-reflective layer 26 can have a uniform thickness.

The organic anti-reflective layer 26 can prevent a side profile of a photoresist pattern from being deteriorated due to diffused reflection in a following exposing process. Particularly, a gate trench can have a width that is substantially equal to or narrower than that which is to be formed by the exposing process, and an interval between the gate trenches becomes narrower. The organic anti-reflective layer 26 may prevent the deterioration of a photoresist pattern formed thereon due to the diffused reflection.

Figure 9:
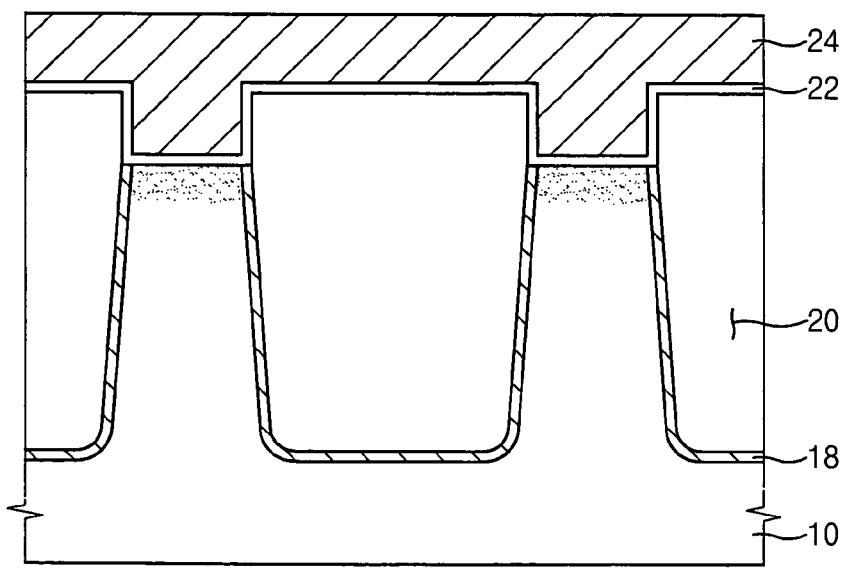
Figure 14:
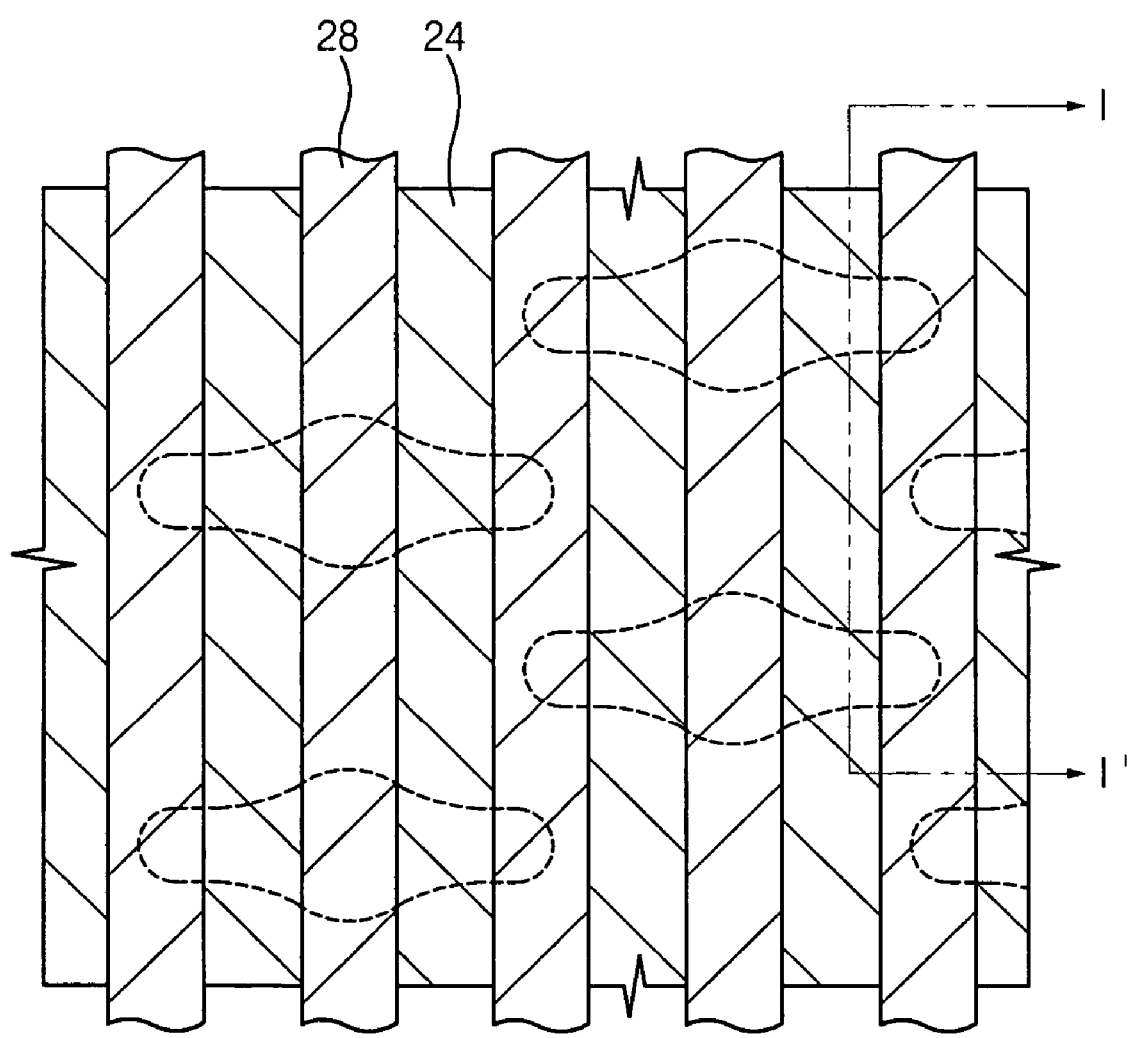

Referring to FIGS. 9 and 14, a photoresist film (not shown) is formed on the organic anti-reflective layer 24. The photoresist film is exposed and developed to form a linear photoresist pattern 28 exposing the gate trench. Particularly, the photoresist pattern 28 partially exposes the gate trench and the field region between adjacent gate trenches.

The organic anti-reflective layer 26 is etched using the photoresist pattern 28 as an etching mask. Exemplary gasses that can be used to etch the organic anti-reflective layer 26 can include a $CH_4$ gas, a $C_2F_6$ gas, a $CHF_3$ gas, and/or a $CH_2F_2$ gas. The etchant gas may further include an oxygen gas. The gas may preferably include a mixture of $CH_4$ gas and oxygen gas because the mixed gas may more rapidly etch the organic anti-reflective layer 26 compared to other gases.

When an organic anti-reflective layer that is formed by a conventional process has a non-uniform thickness, an etching process used to remove a portion of the organic anti-reflective layer may need more time because of the presence of relatively thicker portions of the organic anti-reflective layer. Moreover, the thinner portions of the organic anti-reflective layer may become excessively damaged or a layer that underlies the organic anti-reflective layer may be etched when etching continues on the thicker portions of the organic anti-reflective layer. The thicker portions of the organic anti-reflective layer may also not be completely removed by the etching process.

In contrast, because the organic anti-reflective layer 26 has a uniform thickness in accordance with some embodiments of the present invention, the organic anti-reflective layer 26 may be completely removed in less time than may otherwise be needed if the organic anti-reflective layer 26 did not have a uniform thickness.

Figure 10:
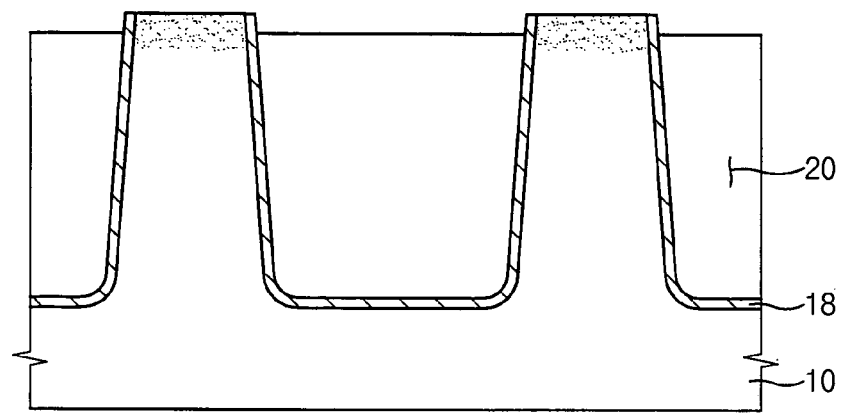
Figure 15:
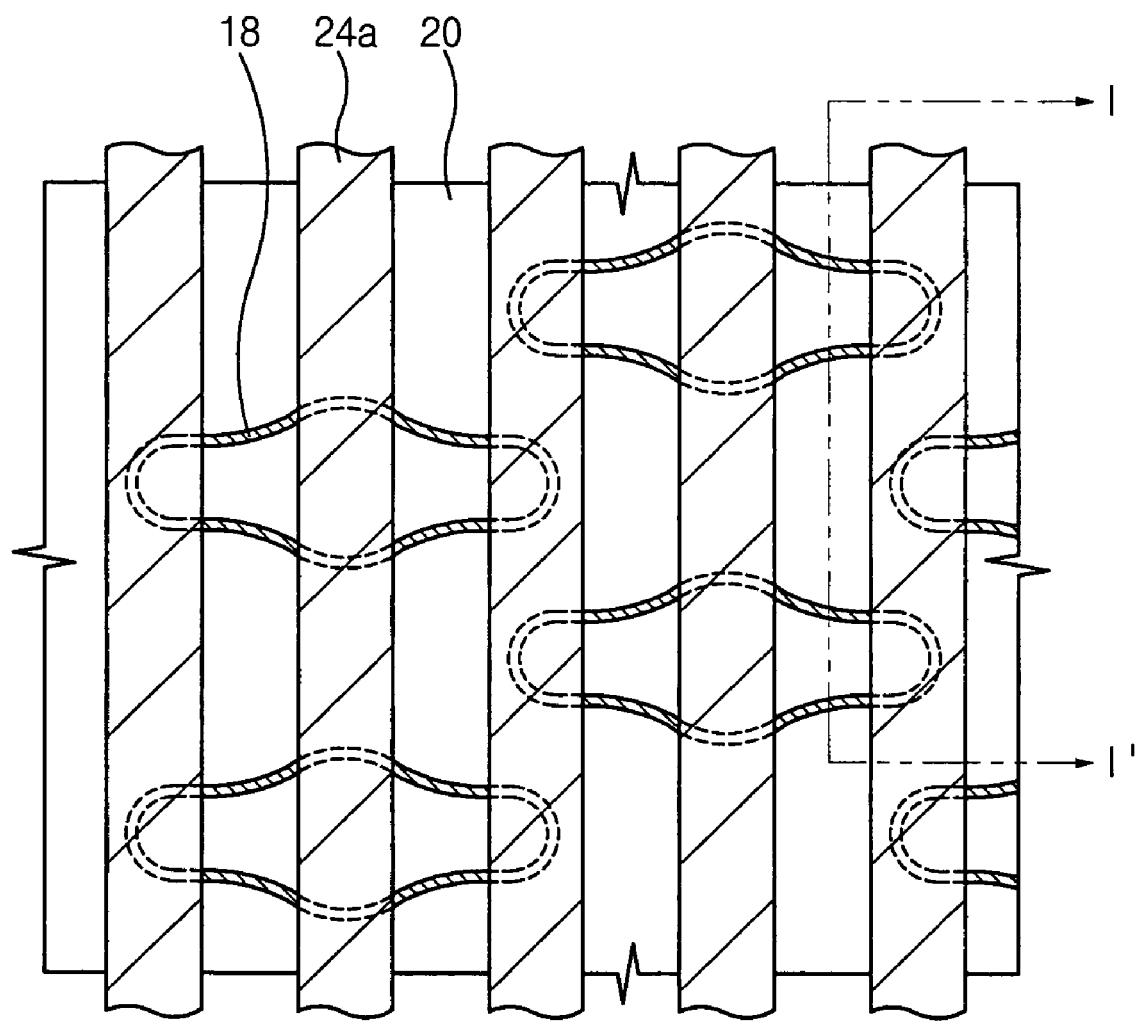

Referring to FIGS. 10 and 15, the second hard mask layer 24 and the second buffer oxide layer 22 are etched to expose the semiconductor substrate 10 in the active region and form a linear second hard mask pattern 24a and a second buffer oxide layer pattern (not shown). The second hard mask layer 24 and the second buffer oxide layer 22 can include silicon oxide-based insulating materials with a substantially identical etching selectivity so that the second hard mask layer 24 and the second buffer oxide layer 22 are etched at substantially the same etching rate. Because the second hard mask layer 24 has a substantially planar upper surface and the second hard mask layer 24 and the second buffer oxide layer 22 also have substantially the same etching selectivity, the second hard mask layer 24 and the second buffer oxide layer 22 can be removed without necessitating a relatively long etching process.

An example gas that may be used to etch the second hard mask layer 24 and the second buffer oxide layer 22 is a mixture of $CH_4$, $CHF_3$ and oxygen. The etching process to remove the second hard mask layer 24 and the second buffer oxide layer 22 may be carried out in-situ in a chamber in which the organic anti-reflective layer 26 is etched.

Because the field oxide layer 20 includes the silicon oxide-based insulating material, the field oxide layer 20 is partially removed after the second buffer oxide layer 22 in the field region is removed. The second hard mask layer 24 and the second buffer oxide layer 22 can be etched for a short time to expose the semiconductor substrate 10 in the active region and so that a recess caused by the etching process can be avoided on a surface portion of the field oxide layer 20

The photoresist pattern 28 can then be removed by an ashing process and/or a stripping process.

Figure 11:
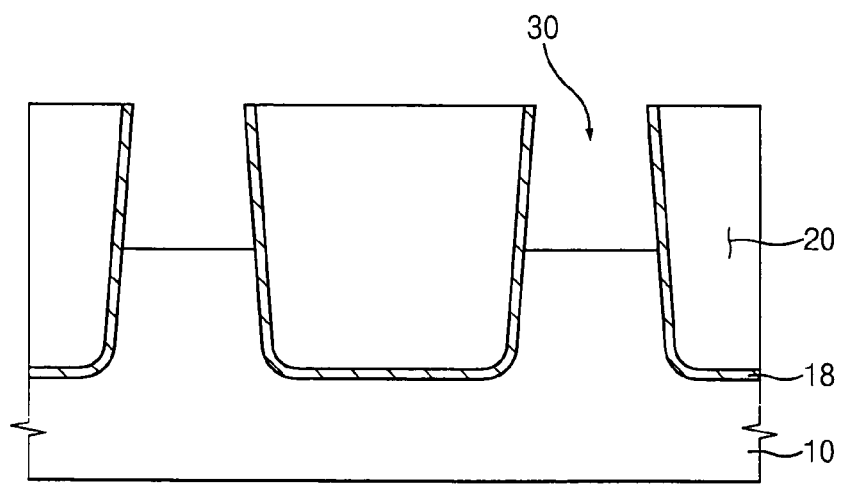
Figure 16:
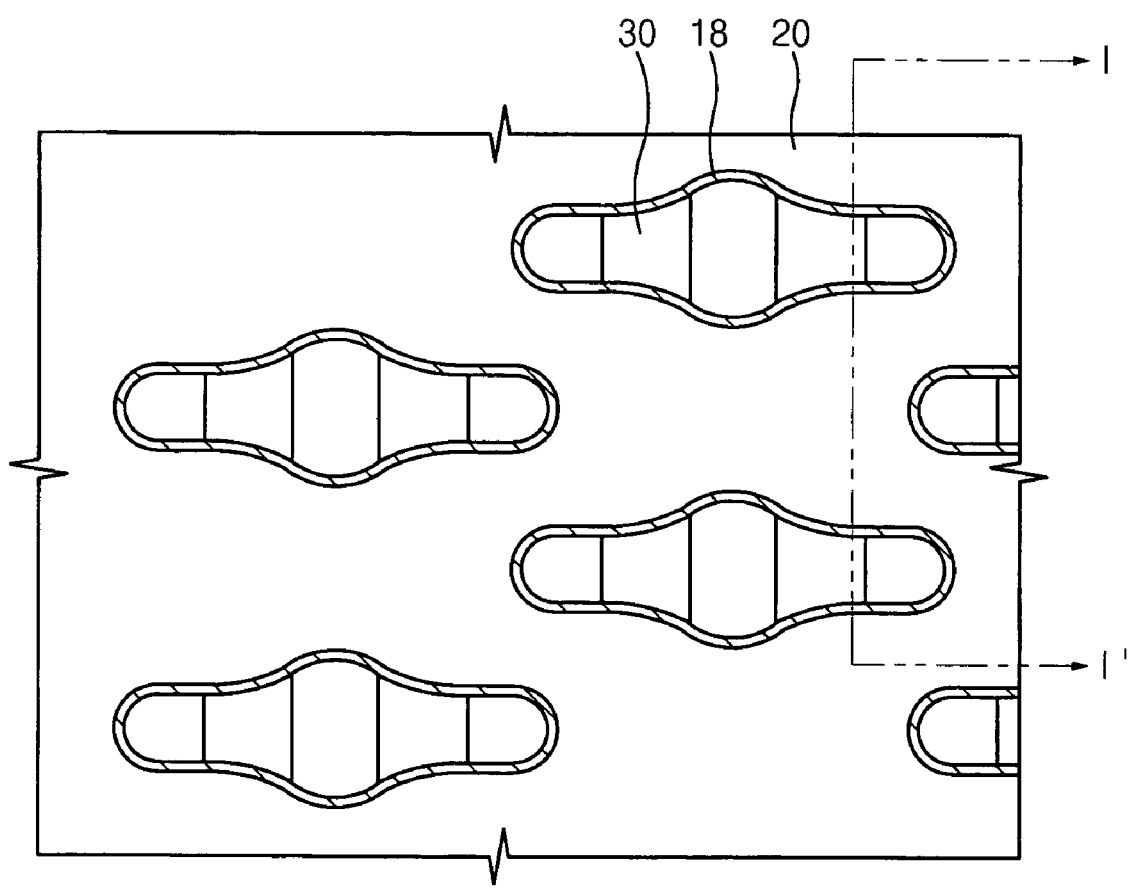

Referring to FIGS. 11 and 16, the semiconductor substrate 10 is etched using the second hard mask pattern 24a and the second buffer oxide layer pattern to form a gate trench 30. As a result, source/drain regions are formed at both sides of the gate trench 30. An etching gas having a high etching selectivity between the semiconductor substrate 10 and the field oxide layer 20 can be used in the etching process to prevent the partial removal of the field oxide layer 20 during the process of etching the semiconductor substrate 10. An exemplary etching gas can include a $Cl_2$ gas. The etching gas may further include an oxygen gas.

Because the second hard mask pattern 24a and the second buffer oxide layer pattern do not remain on a portion of the semiconductor substrate 10 in which the gate trench 30 is formed, the gate trench 30 can have a normal configuration in which the opening of the trench can be more uniform (i.e., not partially blocked).

Additionally, a silicon fence that may remain on an inner side of the gate trench 30 may be removed by a wet etching process and/or a chemical dry etching process. Such a silicon fence may be removed through a wet etching process using, for example, an etching solution having a standard clean 1 (SC1) including $NH_4OH$, $H_2O_2$ and $H_2O$. The SC1 may remove portions of the semiconductor substrate 10, oxide layer, an organic material, etc.

The second hard mask pattern and the second buffer oxide layer pattern in the active region are then removed to expose the semiconductor substrate 10 in the active region.

Figure 12:
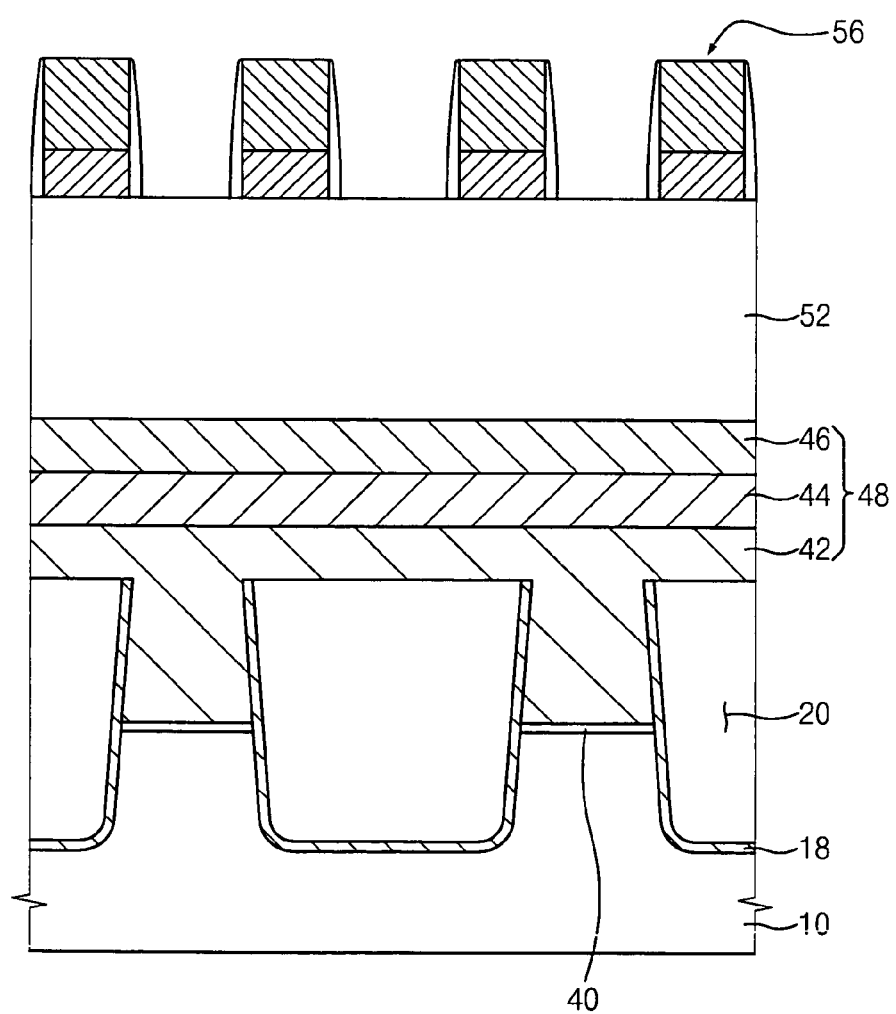

Referring to FIG. 12, a gate insulation layer 40 is formed on the inner face and a bottom face of the gate trench 30. The gate insulation layer 40 may be formed by thermally oxidizing the semiconductor substrate 10 that is exposed through the gate trench 30. Accordingly, the gate insulation layer 40 can be selectively formed on the semiconductor substrate 10 exposed through the gate trench 30 through a thermal oxidation process.

The gate trench 30 is filled with a polysilicon layer (not shown). A tungsten silicide layer (not shown) is formed on the polysilicon layer. A second silicon nitride layer (not shown) for a third hard mask pattern is formed on the tungsten silicide layer.

A second photoresist film (not shown) is formed on the second silicon nitride layer. The second photoresist film is exposed and developed to form a second photoresist pattern (not shown) covering at least one gate trench 30.

The second silicon nitride layer is etched using the second photoresist pattern as an etching mask to form the third hard mask pattern 46. The tungsten silicide layer and the polysilicon layer are etched using the third hard mask pattern 46 as an etching mask to form a gate electrode 48 including a tungsten silicide layer pattern 44 and a polysilicon layer pattern 42. Here, two gate electrodes 48 are formed in the unitary active region.

A silicon nitride layer (not shown) is formed on the gate electrode line 48, the gate insulation layer 40 and the semiconductor substrate 10. The silicon nitride layer is anisotropically etched to form a spacer (not shown) on sidewall of the gate electrode 48 and the gate insulation layer 40.

An insulating interlayer 52 is formed on the gate electrode 48. A contact plug (not shown) is electrically connected to the source/drain regions. A bit line 56 is electrically connected to the contact plug that is electrically connected to the source region. A storage node contact (not shown) is electrically connected to the contact plug that is electrically connected to the drain region. A capacitor (not shown) is electrically connected to the storage node contact, which can complete a DRAM device having the recessed gate electrode.

Accordingly, some embodiments of the present embodiment can provide more complete removal of hard mask material from an area in which the gate trench is to be formed, and can thereby result in a more uniform gate trench. Also, the field oxide layer may not be recessed when forming the gate trench so that the variations in the characteristics of the transistor that can be otherwise caused by such recess may be avoided.

Methods and semiconductor devices in accordance with a second embodiment of the present invention will now be explained below with reference to FIGS. 17 to 20.

FIGS. 17 to 20 are cross sectional views illustrating methods of forming a semiconductor device that includes a recessed gate electrode in accordance with a second embodiment of the present invention.

The methods of forming the semiconductor device in accordance with the second embodiment are substantially the same as those described above with regard to the first embodiment, except for the process for forming a gate trench. Accordingly, the same numerical references refer to the same elements as before and the associated explanation of those elements will be omitted for sake of brevity.

Figure 17:
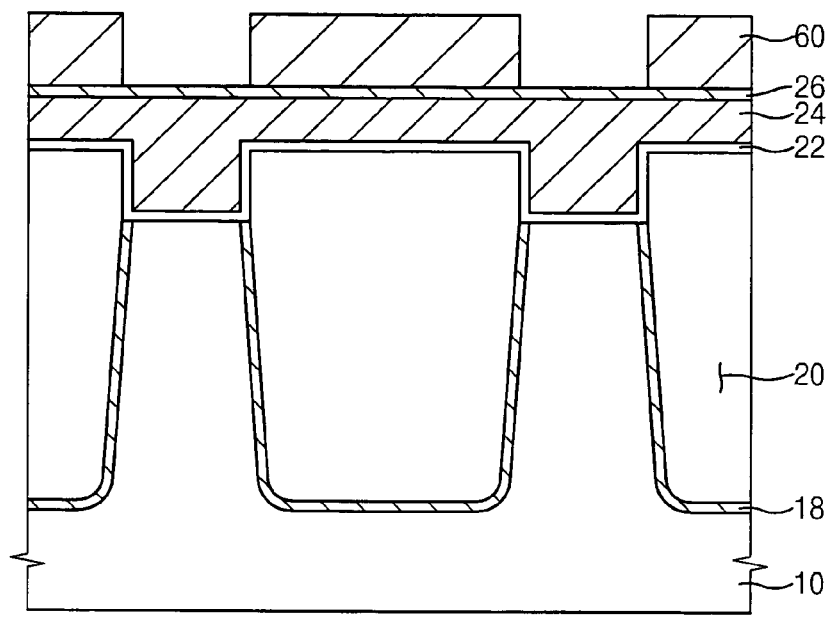
FIGS. 17 to 20 are cross sectional views illustrating methods of forming a semiconductor device that includes a recessed gate electrode in accordance with a second embodiment of the present invention.

Referring to FIG. 17, processes that were explained above with reference to FIGS. 4 to 8 are carried out to define an active region and a field region on the semiconductor substrate 10. Also, the second buffer oxide layer 22, the hard mask layer 24 having a planar upper surface and the organic anti-reflective layer 26 are sequentially formed on the semiconductor substrate 10.

A photoresist film is formed on the anti-reflective layer 26. The photoresist film is patterned to form a photoresist pattern 60. The photoresist pattern 60 can have dot shaped openings that selectively expose a gate trench.

The organic anti-reflective layer 26 is etched using the photoresist pattern 60. Example gasses that may be used to etch the organic anti-reflective layer 26 include a $CH_4$ gas, a $C_2F_6$ gas, a $CHF_3$ gas, and/or a $CH_2F_2$ gas. The etchant gas may further include oxygen. The etchant gas may preferably include a mixture of the $CH_4$ gas and the oxygen gas, because the mixed gas may etch the organic anti-reflective layer 26 more rapidly than some other gases.

Figure 18:
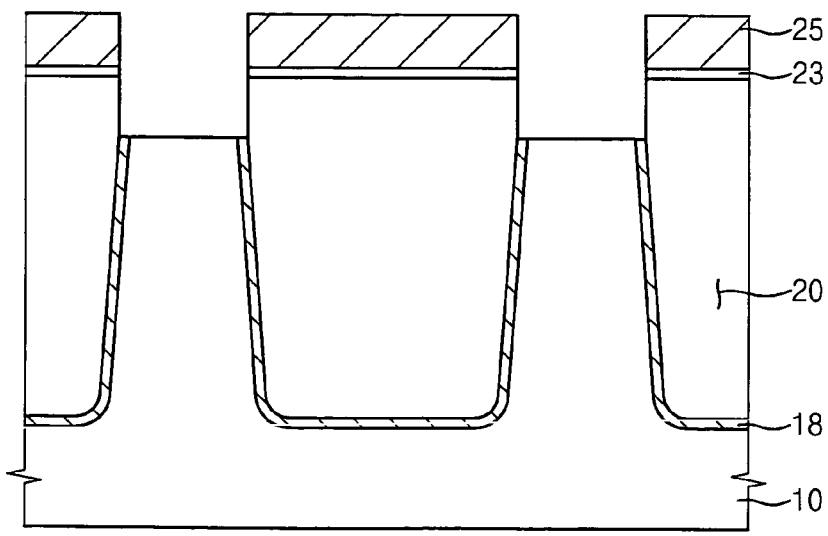

Referring to FIG. 18, the second hard mask layer 24 and the second buffer oxide layer 22 are etched to expose the semiconductor substrate 10 in the active region, and thereby form a dot shaped second hard mask pattern 25 and a dot shaped second buffer oxide layer pattern 23. The second hard mask layer 24 and the second buffer oxide layer 22 can include silicon oxide-based insulating materials having a substantially identical etching selectivity relative to each other so that the second hard mask layer 24 and the second buffer oxide layer 22 can be etched at substantially the same etching rate. Because the second hard mask layer 24 has a substantially planar upper surface and the second hard mask layer 24 and the second buffer oxide layer 22 can also have substantially the same etching selectivity, the second hard mask layer 24 and the second buffer oxide layer 22 may be completely removed without necessitating a relative long etching process.

An example etching gas that may be used to etch the second hard mask layer 24 and the second buffer oxide layer 22 can include a mixture of a $CH_4$ gas, a $CHF_3$ gas and/or an oxygen gas. The etching process to remove the second hard mask layer 24 and the second buffer oxide layer 22 may be carried out in-situ in a chamber in which the organic anti-reflective layer 26 is etched.

Further, the field oxide layer 20 is covered by the second hard mask pattern 24 so that the field oxide layer may not be removed in the etching process. The photoresist pattern 60 and the organic anti-reflective layer 26 are then removed by an ashing process and/or a stripping process.

Figure 19:
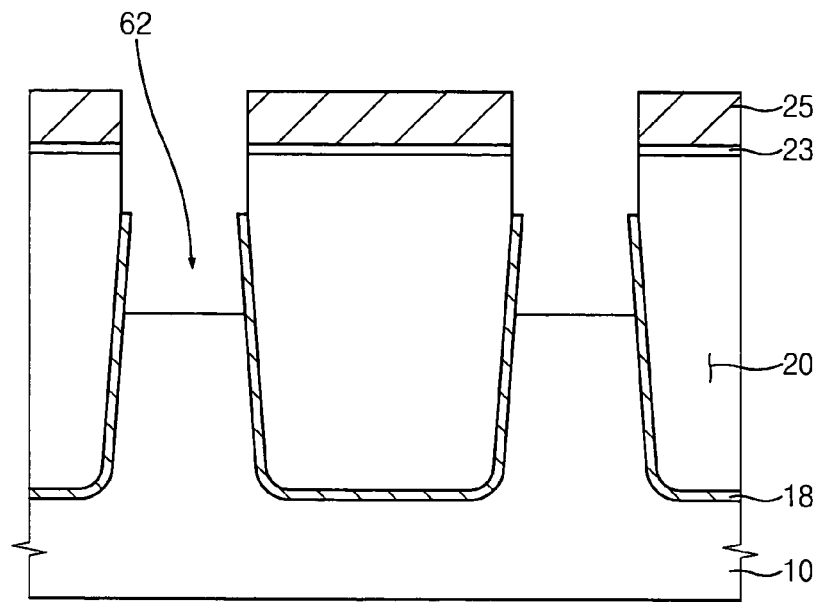

Referring to FIG. 19, the semiconductor substrate 10 is etched using the second hard mask pattern 25 and the second buffer oxide layer pattern 23 as a mask to form the gate trench 62. Etching may be carried out using a $Cl_2$ gas, and which may further include oxygen.

Because the second hard mask pattern 25 and the second buffer oxide layer pattern 23 do not remain on a portion of the semiconductor substrate 10 in which the gate trench 62 is formed, and the gate trench 62 can thereby have a more uniform shape.

Additionally, a silicon fence that can remain on an inner side of the gate trench 62 may be removed by a wet etching process and/or a chemical dry etching process.

Figure 20:
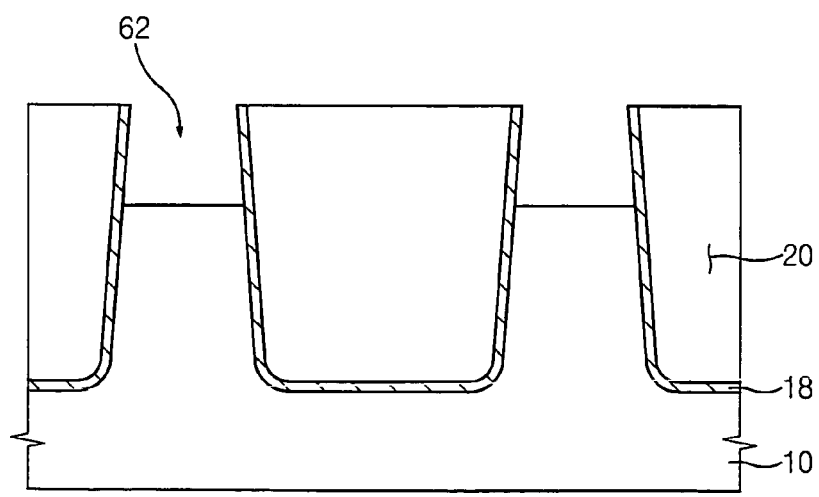

Referring to FIG. 20, the second hard mask pattern 25 and the second buffer oxide layer pattern 23 are then removed to expose the semiconductor substrate 10 in the active region.

A gate insulation layer (not shown) is formed on the inner face and a bottom face of the gate trench 62. The gate trench 62 is filled with a polysilicon layer (not shown). A tungsten silicide layer (not shown) is formed on the polysilicon layer. A second silicon nitride layer (not shown) for a third hard mask pattern is formed on the tungsten silicide layer.

A second photoresist film (not shown) is formed on the second silicon nitride layer. The second photoresist film is exposed and developed to form a second photoresist pattern (not shown) covering at least one gate trench 62.

The second silicon nitride layer is etched using the second photoresist pattern as an etching mask to form the third hard mask pattern. The tungsten silicide layer and the polysilicon layer are etched using the third hard mask pattern as an etching mask to form a gate electrode (not shown) including a tungsten silicide layer pattern (not shown) and a polysilicon layer pattern (not shown).

A silicon nitride layer (not shown) is formed on the gate electrode line, the gate insulation layer and the semiconductor substrate 10. The silicon nitride layer is anisotropically etched to form a spacer (not shown) on sidewalls of the gate electrode and the gate insulation layer.

An insulating interlayer is formed on the gate electrode. A contact plug (not shown) is electrically connected to the source/drain regions. A bit line (not shown) is electrically connected to the contact plug that is electrically connected to the source region. A storage node contact (not shown) is electrically connected to the contact plug that is electrically connected to the drain region. A capacitor (not shown) is electrically connected to the storage node contact to complete a DRAM device having the recessed gate electrode.

According to some embodiments of the present embodiment, the photoresist pattern for gate trench can have dot shaped openings. Thus, the field oxide layer may not be exposed by the etching process to form the gate trench and so that the field oxide layer may thereby not be recessed.

Accordingly, in some embodiments of the present invention, the hard mask layer can have a substantially planar upper surface on the active region and the field region. When forming the hard mask layer pattern, the substantially planar upper surface of the hard mask layer may allow it to be more completely removed from an area in which the gate trench is to be formed. Consequently, the hard mask layer pattern may be used to form a more uniform gate trench in the substrate because of the more complete removal of the hard mask layer material from the area in which the gate trench is desired to be formed.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

What is claimed is:

1. A method of forming a device, the method comprising:
   defining a field region and an active region of a substrate, the field region having an upper surface that extends further away from the substrate and is higher than an upper surface of the active region;
   forming a hard mask layer with a substantially planar upper surface on the field region and the active region;
   partially etching the hard mask layer to form a hard mask pattern that exposes at least a portion of the active region;
   partially etching the substrate in the active region using the hard mask pattern as an etching mask to form a gate trench; and
   forming a recessed gate electrode on the substrate in the gate trench.

2. The method of claim 1, wherein defining the field region and the active region comprises:
   forming an initial hard mask pattern on the substrate that exposes the field region and covers the active region;
   partially etching the substrate using the initial hard mask pattern as an etching mask to form an isolation trench in the field region;
   filling the isolation trench and a space between the initial hard mask patterns in the field region with a field oxide layer; and
   removing the initial hard mask pattern, wherein an upper surface of the field oxide layer is higher than an upper surface of the substrate.

3. The method of claim 1, after defining the field region and the active region, further comprising forming a buffer oxide layer on the field region and the active region.

4. The method of claim 3, wherein the buffer oxide layer comprises a middle temperature oxide layer.

5. The method of claim 3, wherein the hard mask pattern comprises a material having an etching selectivity of about 1:0.9 to about 1:1.1 with respect to the buffer oxide layer.

6. The method of claim 1, wherein the hard mask pattern comprises boron phosphorus silicate glass (BPSG), undoped silicate glass (USG), phosphorus silicate glass (PSG), and/or flowable oxide (FOX).

7. The method of claim 1, further comprising forming a substantially planar anti-reflective layer on the substantially planar upper surface of the hard mask pattern.

8. The method of claim 7, wherein the substantially planar anti-reflective layer comprises an organic material.

9. The method of claim 7, wherein partially etching the hard mask layer in the active region to form the hard mask pattern comprises:
   forming a photoresist pattern on the substantially planar anti-reflective layer that selectively exposes portions of the substantially planar anti-reflective layer that overlie an area in which the gate trench is to be formed;
   removing portions of the substantially planar anti-reflective layer exposed by the photoresist pattern to partially expose portions of the hard mask layer; and
   removing the exposed portions of the hard mask layer to form the hard mask pattern.

10. The method of claim 9, wherein the hard mask pattern comprises a linear pattern that exposes regions over the substrate in which the gate trench is to be formed and a portion of the field region between adjacent gate trenches.

11. The method of claim 9, wherein the hard mask pattern comprises a dotted pattern that selectively exposes regions over the substrate in which the gate trench is to be formed.

12. A method of forming a device, the method comprising:
   defining a field region and a plurality of active regions of a substrate, the field region having an upper surface that extends further away from the substrate and is higher than an upper surface of the active regions;
   forming a buffer oxide layer on the substrate in the active regions;
   forming a hard mask layer with a substantially planar upper surface on the buffer oxide layer;
   forming a substantially planar organic anti-reflective layer on the substantially planar upper surface of the hard mask layer;
   partially etching the organic anti-reflective layer, the hard mask layer and the buffer oxide layer to form a hard mask pattern that exposes at least a portion of the active regions;
   partially etching the substrate in the active region using the hard mask pattern as an etching mask to form a gate trench; and
   forming a recessed gate electrode on the substrate in the gate trench.

13. The method of claim 12, wherein the buffer oxide layer comprises a middle temperature oxide layer.

14. The method of claim 12, wherein the hard mask pattern comprises boron phosphorus silicate glass (BPSG), undoped silicate glass (USG), phosphorus silicate glass (PSG), and/or flowable oxide (FOX).

15. The method of claim 12, wherein partially etching the organic anti-reflective layer, the hard mask layer and the buffer oxide layer to form a hard mask pattern that exposes at least a portion of the active regions comprises:
- forming a photoresist pattern that selectively exposes regions of the organic anti-reflective layer that are aligned with active regions of the substrate in which the gate trench is to be formed;
- removing portions of the anti-reflective layer exposed through the photoresist pattern to partially expose portions of the hard mask layer; and
- removing the exposed portions of the hard mask layer to form the hard mask pattern.

16. The method of claim 12, wherein the hard mask pattern comprises a linear pattern that exposes regions over the substrate in which the gate trench is to be formed and a portion of the field region between adjacent gate trenches.

17. The method of claim 12, wherein the hard mask pattern comprises a dotted pattern that selectively exposes regions over the substrate in which the gate trench is to be formed.

18. The method of claim 12, after forming the buffer oxide layer, further comprising implanting impurities into the active regions of the substrate to form source/drain regions.

19. The method of claim 12, after forming the gate electrode, further comprising implanting impurities into the active regions of the substrate to form source/drain regions.

* * * * *